(12) United States Patent
Guliani et al.

(10) Patent No.: US 6,629,047 B1
(45) Date of Patent: Sep. 30, 2003

(54) METHOD AND APPARATUS FOR FLASH VOLTAGE DETECTION AND LOCKOUT

(75) Inventors: Sandeep K. Guliani, Folsom, CA (US); Rajesh Sundaram, Fair Oaks, CA (US); Hari M. Rao, Hillsboro, OR (US); Johnny Javanifard, Carmichael, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/539,475

(22) Filed: Mar. 30, 2000

(51) Int. Cl.$^7$ ................................................ G11C 13/00
(52) U.S. Cl. ..................... 702/64; 702/57; 702/108; 702/117; 702/118; 702/183; 702/185
(58) Field of Search ................ 702/57–59, 64, 702/65, 108, 117, 118, 119, 124, 126, 183, 185, 186, 188, FOR 103–106, FOR 111, FOR 134, FOR 170, FOR 171; 327/18, 27; 365/50, 52, 63, 72, 77, 143; 323/281, 282, 283, 284

(56) References Cited

U.S. PATENT DOCUMENTS

| | | | | |
|---|---|---|---|---|
| 4,975,883 A | * | 12/1990 | Baker et al. ................. | 365/226 |
| 5,040,088 A | * | 8/1991 | Harrington et al. ........... | 361/31 |
| 5,301,161 A | * | 4/1994 | Landgraf et al. ............. | 365/229 |
| 5,420,798 A | * | 5/1995 | Lin et al. .................... | 364/483 |
| 5,428,566 A | * | 6/1995 | Robinson ..................... | 365/65 |
| 5,438,549 A | * | 8/1995 | Levy ......................... | 365/229 |
| 5,483,486 A | * | 1/1996 | Javanifard et al. .......... | 365/185.17 |
| 5,495,453 A | * | 2/1996 | Wociechowski et al. .. | 365/185.18 |
| 5,535,168 A | * | 7/1996 | Yepez, III et al. .......... | 365/227 |
| 5,559,717 A | * | 9/1996 | Tedrow et al. .............. | 364/483 |
| 5,602,789 A | * | 2/1997 | Endoh et al. ............... | 365/201 |
| 5,671,179 A | * | 9/1997 | Javanifard ............. | 365/185.33 |
| 5,784,314 A | * | 7/1998 | Sali et al. ................. | 365/185.2 |
| 5,805,091 A | * | 9/1998 | Sherry et al. ................ | 341/120 |
| 5,854,762 A | * | 12/1998 | Pascucci ................. | 365/185.04 |
| 5,898,634 A | * | 4/1999 | Chevallier ................ | 365/226 |
| 5,912,855 A | * | 6/1999 | McLaury .................... | 365/226 |
| 5,946,258 A | * | 8/1999 | Evertt et al. ................ | 365/226 |
| 5,956,270 A | * | 9/1999 | Shimomura et al. ... | 365/185.18 |
| 5,956,289 A | * | 9/1999 | Norman et al. ............. | 365/233 |
| 6,028,798 A | * | 2/2000 | Roohparvar ................ | 365/201 |
| 6,160,755 A | * | 12/2000 | Norman et al. ............. | 365/233 |
| 6,204,701 B1 | * | 3/2001 | Tsay et al. .................. | 327/143 |
| 6,288,629 B1 | * | 9/2001 | Cofino et al. .............. | 340/10.1 |

FOREIGN PATENT DOCUMENTS

JP          411317648 A  * 11/1999

* cited by examiner

*Primary Examiner*—Marc S. Hoff
*Assistant Examiner*—Carol S. W. Tsai
(74) *Attorney, Agent, or Firm*—Peter Lam

(57) ABSTRACT

A method for voltage detection and lockout. The method of one embodiment first compares a reference voltage to a supply voltage to determine whether the voltage supply voltage is greater than the reference voltage. The reference voltage is validated by determining whether the reference voltage is at least a valid voltage potential. An unlock signal is generated if the supply voltage is greater than the reference voltage and if the reference voltage is valid.

23 Claims, 7 Drawing Sheets

METHOD AND APPARATUS FOR FLASH VOLTAGE DETECTION AND LOCKOUT

FIELD OF THE INVENTION

The present invention relates generally to the field of computers and computer systems. More particularly, the present invention relates to a method and apparatus for a low voltage detection and lockout protection in a flash electrically erasable programmable read only memory array (flash EEPROM).

BACKGROUND OF THE INVENTION

Many of today's computing applications such as cellular phones, digital cameras, and personal computers, use non-volatile memories to store data or code. Non-volatility is advantageous because it allows the computing system to retain its data and code even when power is removed from the computing system. Thus if the system is turned off or if there is a power failure, there is no loss of code or data.

Nonvolatile semiconductor memory devices are fundamental building blocks in computer system designs. One such nonvolatile memory device is flash memory. Flash memory, also referred to as flash Electrically Erasable Programmable Read-Only Memory (flash EEPROMs) or flash memory, can be programmed by the user, and once programmed, the flash memory retains its data until the memory is erased. Electrical erasure of the flash memory erases the contents of the memory of the device. The flash memory can then be programmed with new code or data. The primary mechanism by which data is stored in flash memory is a flash memory cell.

A flash EEPROM memory device (cell) is a floating gate MOS field effect transistor having a drain region, a source region, a floating gate, and a control gate. Conductors are connected to each drain, source, and control gate for applying signals to the transistor. A flash EEPROM cell is capable of functioning in the manner of a normal EPROM cell and will retain a programmed value when power is removed from the circuitry. A flash EEPROM cell may typically be used to store a one or zero condition. If multilevel cell (MLC) technology is used, multiple bits of data may be stored in each flash EEPROM cell. Unlike a typical EPROM cell, a flash EEPROM cell is electrically erasable in place and does not need to be removed and diffused with ultraviolet to accomplish erasure of the memory cells.

Arrays of such flash EEPROM memory cells have been used in computers and similar circuitry as both read only memory and as long term storage which may be both read and written. These cells require accurate values of voltage be furnished in order to accomplish programming and reading of the devices. Arrays of flash EEPROM memory devices are typically used for long term storage in portable computers where their lightweight and rapid programming ability offer distinct advantages offer electromechanical hard disk drives.

A number of the electronic systems that use flash memories are small portable devices that rely on batteries for power. As new applications emerge, system designers are open to alternative methods of increasing the battery life of these devices by reducing power consumption. However, the tendency has been to reduce the power requirements of such portable computers to make the computers lighter and to increase the length of use between recharging. This has required that the voltage supply potentials available to the flash memory arrays be reduced.

As the product lines moves towards lower power designs, the VCC supply voltage of some flash memories has also moved to lower levels like 1.8 volt. Similarly, the customer specification for the lockout voltage of the part has also moved to lower VCC ranges. The lockout voltage is defined as the voltage level on the VCC supply below which the flash part will lock itself out from performing any user mode algorithms (program/erase) or read.

In conventional prior art products, the VCC lockout detection was implemented by using a flash cell whose threshold voltage was trimmed to the target lockout voltage of the part. The VCC voltage level was sensed by applying the VCC potential to the gate terminal of this flash cell and then waiting for the drain terminal of the flash cell to be pulled to ground, since the source terminal is grounded. This implementation was acceptable for lockout voltages as low as 2.3 volts.

However, in a 1.8 volt flash part, the lockout voltage has moved down to as low as just 1 volt. The flash cell based VCC lockout detection has a number of limitations in this situation. First, erasing a flash cell all the way down to 1 volt can take a long time. The ultraviolet threshold voltage (UV $V_t$) of the flash cell in some semiconductor processes can be as high as 3.5 volts. Hence erasing a flash cell from a $V_t$ of 3.5 volts down to 1 volt instead of a higher voltage can increase the erase time significantly. Second, this prior art scheme can be sensitive to temperature variations. Hence there is a need for a stable VCC lockout detector that could detect low VCC levels of approximately 1 volt and below. Embodiments of the present invention can serve to eliminate the need for a flash cell based VCC level detection.

BRIEF DESCRIPTION OF THE DRAWINGS

The present invention is illustrated by way of example and not limitations in the figures of the accompanying drawings, in which like references indicate similar elements, and in which.

DETAILED DESCRIPTION

A method and apparatus for voltage detection and lockout is disclosed. The described voltage detection and lockout mechanism is used to detect low power supply voltages and provide lockout protection in nonvolatile writable memory, but is not so limited. The embodiments described herein are described in the context of a nonvolatile writable memory or flash memory, but are not so limited. Although the following embodiments are described with reference to nonvolatile writable memories and flash memory, other embodiments are applicable to other circuits that have memory arrays or low power voltage supplies. The same techniques and teachings of the present invention can easily be applied to other types of circuits or semiconductor devices that need low voltage detection and lockout protection.

As circuit designers work to reduce the power requirements of user applications, the VCC supply levels provided to semiconductor devices have been rapidly decreasing. Some flash memory parts now operate with a 1.8 VCC supply voltage. Accordingly, power up circuits that can handle the lower VCC supply voltages are needed.

Keeping in line with the goal to achieve low standby power in order to save battery life, VCC power up detectors that consume low power are desirable. Some existing power up detectors consume standby current on the order of up to 10 microamps ($\mu$A). In newer flash memory parts, there existed a need to reduce standby power consumption by the VCC power up/lockout detectors to less than 2 $\mu$A. Embodiments of the present invention can improve the performance of VCC power-up detectors and thus reduce standby power consumption.

During the initial VCC power up of a low voltage part, there is need to determine the instant at which the charge pumps (both positive and negative) should be turned. The charge pumps need to be turned on to charge their respective output nodes towards the read value, thus facilitating the ability to perform a fast read after VCC power up. Conventional VCC detectors used one additional flash cell to determine when the charge pumps should be turned on. These prior art VCC detectors would trip at specific VCC level that was higher than the lockout level. This prior art scheme was difficult and complex. Embodiments of the present invention can simplify VCC detection and pump turn on. One embodiment combines the lockout detector and the pump turn on instant detector into one circuit, simplifying the overall design and helping to save power. This scheme allows for simple pump turn on time determination during VCC slew up without having to use two flash cells.

Embodiments of the present invention can also be adjusted for VCC scalability. A circuit designer can easily adjust the detector trip points to fit the VCC requirements. This mechanism offers stability across semiconductor processes and temperature, making this method favorable to be used in future chip designs in low voltage/low power applications.

Figure 1:
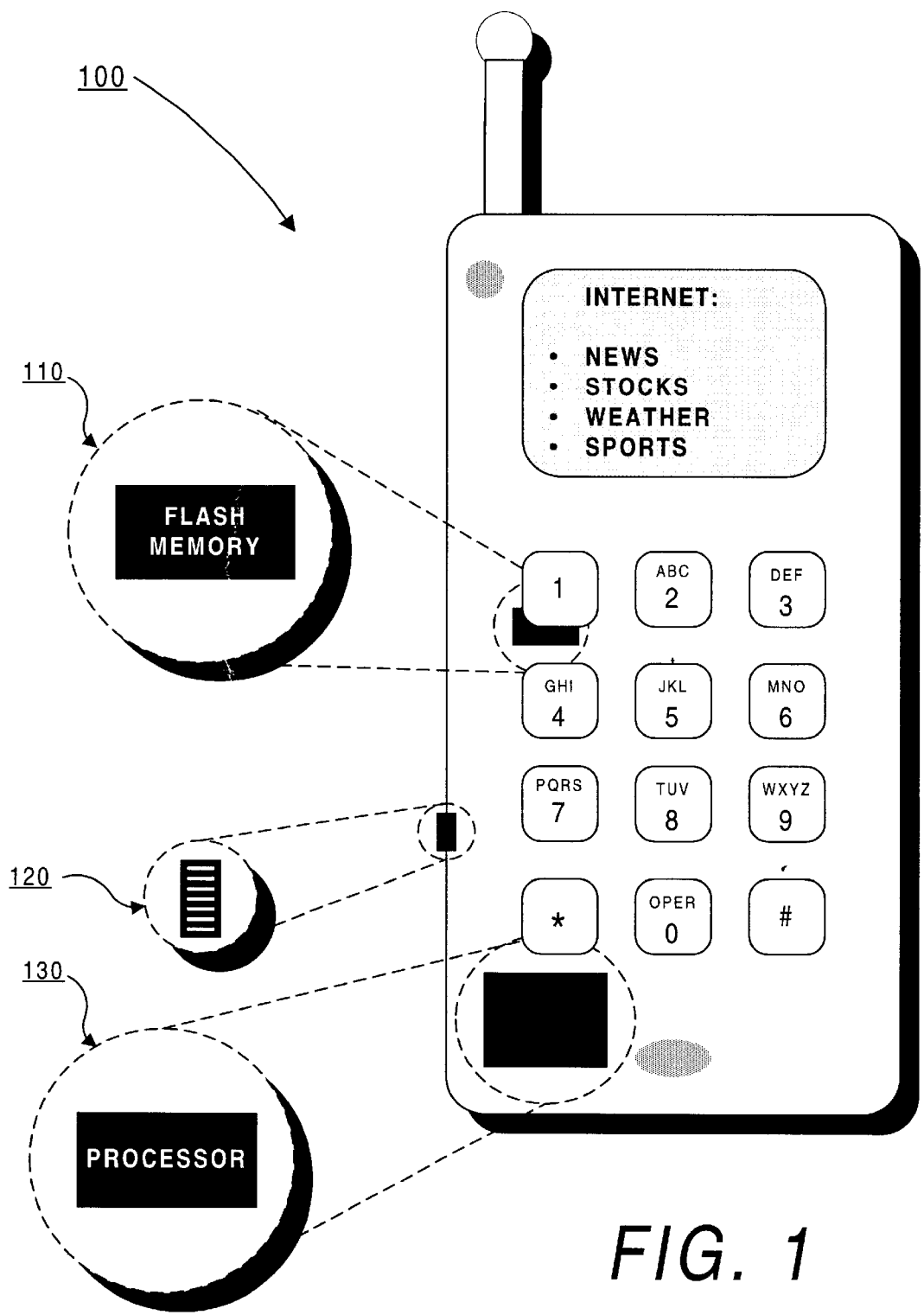
FIG. 1 illustrates one embodiment of a cellular telephone using a flash memory device.

Referring now to FIG. 1, there is an example of a cellular telephone 100 using a flash memory device 110. The cellular telephone 100 shown in FIG. 1 is a digital phone capable of internet access. For example, a user can download and receive information from the Internet via cellular access. This cellular phone 100 can be a Personal Communications Service (PCS) phone using digital cellular technology such as Code-Division Multiple Access (CDMA), Time Division Multiple Access (TMDA), or Global System for Mobile (GSM) Communications. Similarly, flash memory can also be used in analog type cellular phones. Thus, the present invention is not limited to any specific combination of hardware circuitry and software.

Flash memory 110 and a processor 130 are located within cellular phone 100. Flash memory 110 has been designed to include a fast program mode. Processor 130 can be an embedded processor or a digital signal processing (DSP) chip. The phone 100 of FIG. 1 also includes a access port 120. Access port 120 can be used to physically link the phone 100 to an external system for code and/or data update. For instance, the flash memory can be updated through the access port interface or through a download via cellular transmission.

A memory update via the access port 120 is an example of an in-system write. In system write utilizes the system processor 130 to execute flash memory erase and program algorithms. An engineer creates erase, program and verify algorithms and then downloads these algorithms into the system random access memory (RAM). The processor 130 executes the algorithms and ports code to the flash memory 110 for updates. In-system write is also a way to perform PC BIOS code updates.

The present invention is not limited to cellular phones. Alternative embodiments of the present invention can be used in other types of devices such as handheld devices and embedded applications. Some examples of handheld devices include Internet Protocol devices, digital cameras, personal digital assistants (PDAs), and handheld PCs. Embedded applications can include a microcontroller, a digital signal processor (DSP), system on a chip, network computers (NetPC), set-top boxes, network hubs, wide area network (WAN) switches, or any other system which uses flash memory for other embodiments. Flash memory is also used in personal computers (PC) and other computer systems.

For another embodiment of a system, one implementation of a memory including a voltage detection and lockout mechanism can be used with a system on a chip. One embodiment of a system on a chip comprises of a processor and a memory. The memory for one system is a flash memory. The flash memory can be located on the same die as the processor and other system components. Additionally, other logic blocks such as a memory controller or graphics controller can also be located on a system on a chip. By including one embodiment of the present invention on the system on a chip, the flash memory can be updated quickly and with minimal inconvenience to a user.

Figure 2:
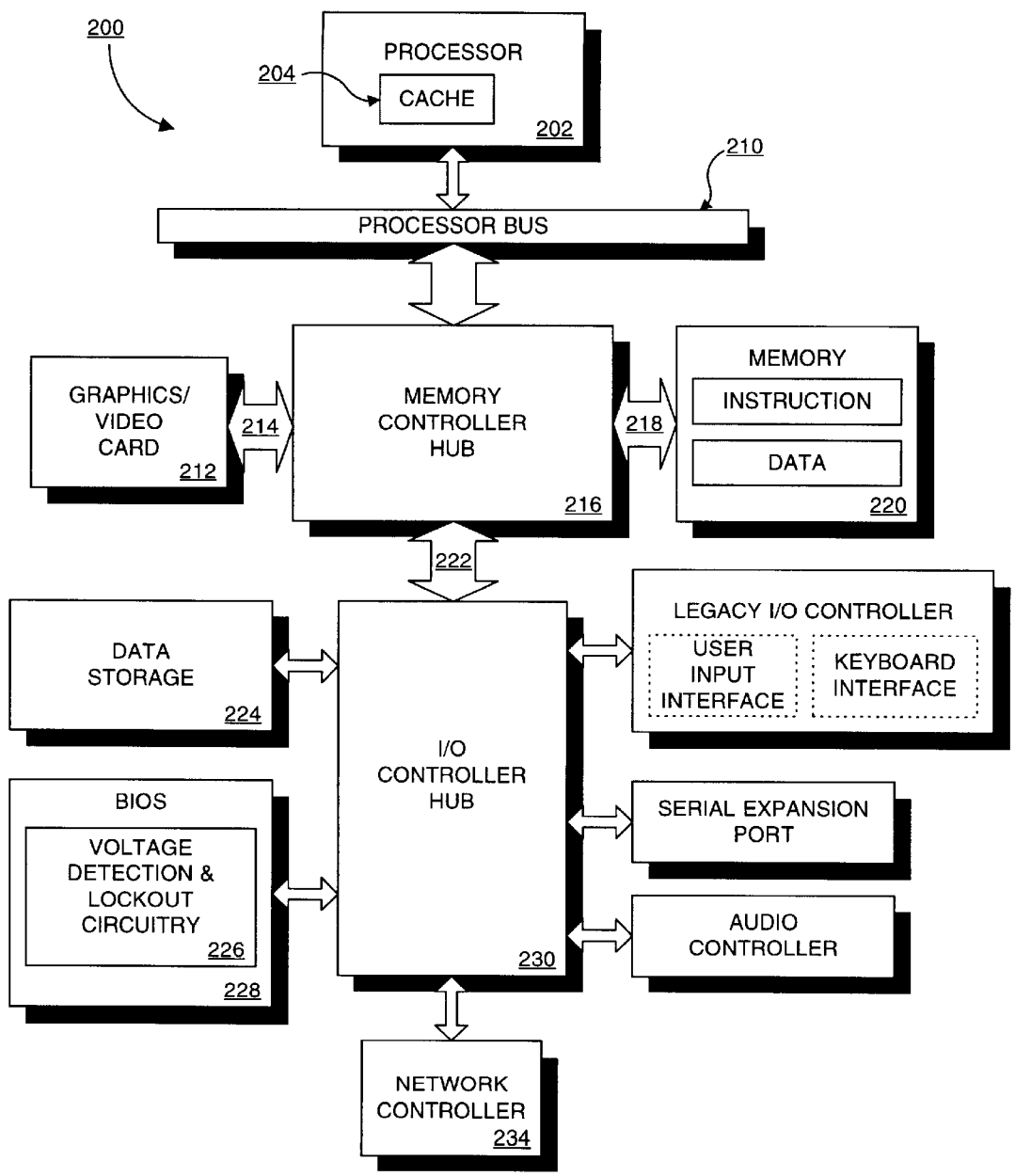
FIG. 2 illustrates one embodiment of a computer system with a memory employing a voltage detection and lockout mechanism.

Referring now to FIG. 2, a computer system 200 is shown. System 200 is representative of processing systems based on the PENTIUM®, PENTIUM® Pro, PENTIUM® II, PENTIUM® III microprocessors available from Intel Corporation of Santa Clara, Calif., although other systems (including PCs having other microprocessors, engineering workstations, set-top boxes and the like) may also be used. Thus, the present invention is not limited to any specific combination of hardware circuitry and software. System 200 includes a component, such as a flash memory, employing a voltage detection and lockout mechanism in accordance with the present invention, such as in the embodiment described herein.

FIG. 2 is a block diagram of one embodiment of a system 200. The computer system 200 includes a processor 202 that processes data signals. The processor 202 may be a complex instruction set computer (CISC) microprocessor, a reduced instruction set computing (RISC) microprocessor, a very long instruction word (VLIW) microprocessor, a processor implementing a combination of instruction sets, or other processor device, such as a digital signal processor, for example. FIG. 2 shows an example of an embodiment of the present invention implemented in a single processor system 200. However, it is understood that other embodiments may alternatively be implemented as systems having multiple processors. Processor 202 is coupled to a processor bus 210 that transmits data signals between processor 202 and other components in the system 200. The elements of system 200 perform their conventional functions well known in the art.

System 200 includes a memory 220. Memory 220 may be a dynamic random access memory (DRAM) device, a static random access memory (SRAM) device, flash memory device, or other memory device. A cache memory 204 can reside inside processor 202 that stores data signals stored in memory 220. Alternatively, in another embodiment, the cache memory may reside external to the processor.

A system logic chip 216 is coupled to the processor bus 210 and memory 220. The processor 202 communicates to a memory controller hub (MCH) 216 via a processor bus 210. The MCH 216 provides a high bandwidth memory path 218 to memory 220 for instruction and data storage and for storage of graphics commands, data and textures. The MCH 216 directs data signals between processor 202, memory 220, and other components in the system 200 and bridges the data signals between processor bus 210, memory 220, and system I/O 222. The graphics card 212 is coupled to the MCH 216 through an Accelerated Graphics Port (AGP) interconnect 214.

System 200 uses a proprietary hub interface bus 222 to couple the MCH 216 to the I/O controller hub (ICH) 230. The ICH 230 provides direct connections to I/O devices. Some examples of these I/O devices are the audio controller, BIOS 228, data storage 224, legacy I/O controller containing user input and keyboard interfaces, a serial expansion port such as Universal Serial Bus (USB), and a network controller 234. The data storage device 224 can comprise a hard disk drive, a floppy disk drive, a CD-ROM device, a flash memory device, or other mass storage device.

A voltage detection and lockout mechanism 226 resides in the flash memory BIOS 228 in this embodiment. The BIOS 228 can be part of a firmware hub. For alternate embodiments, a voltage detection and lockout mechanism 226 can also be used in processors, microcontrollers, embedded processors, graphics devices, DSPs, and other types of logic circuits.

The present enhancement is not limited to computer systems. Alternative embodiments of the present invention can be used in other devices such as, for example, handheld devices and embedded applications. Some examples of handheld devices include cellular phones, Internet Protocol devices, digital cameras, personal digital assistants (PDAs), and handheld PCs. Embedded applications can include a microcontroller, a digital signal processor (DSP), system on a chip, network computers (NetPC), set-top boxes, network hubs, wide area network (WAN) switches, or any other system which uses a latch type mechanism for other embodiments.

Figure 3:
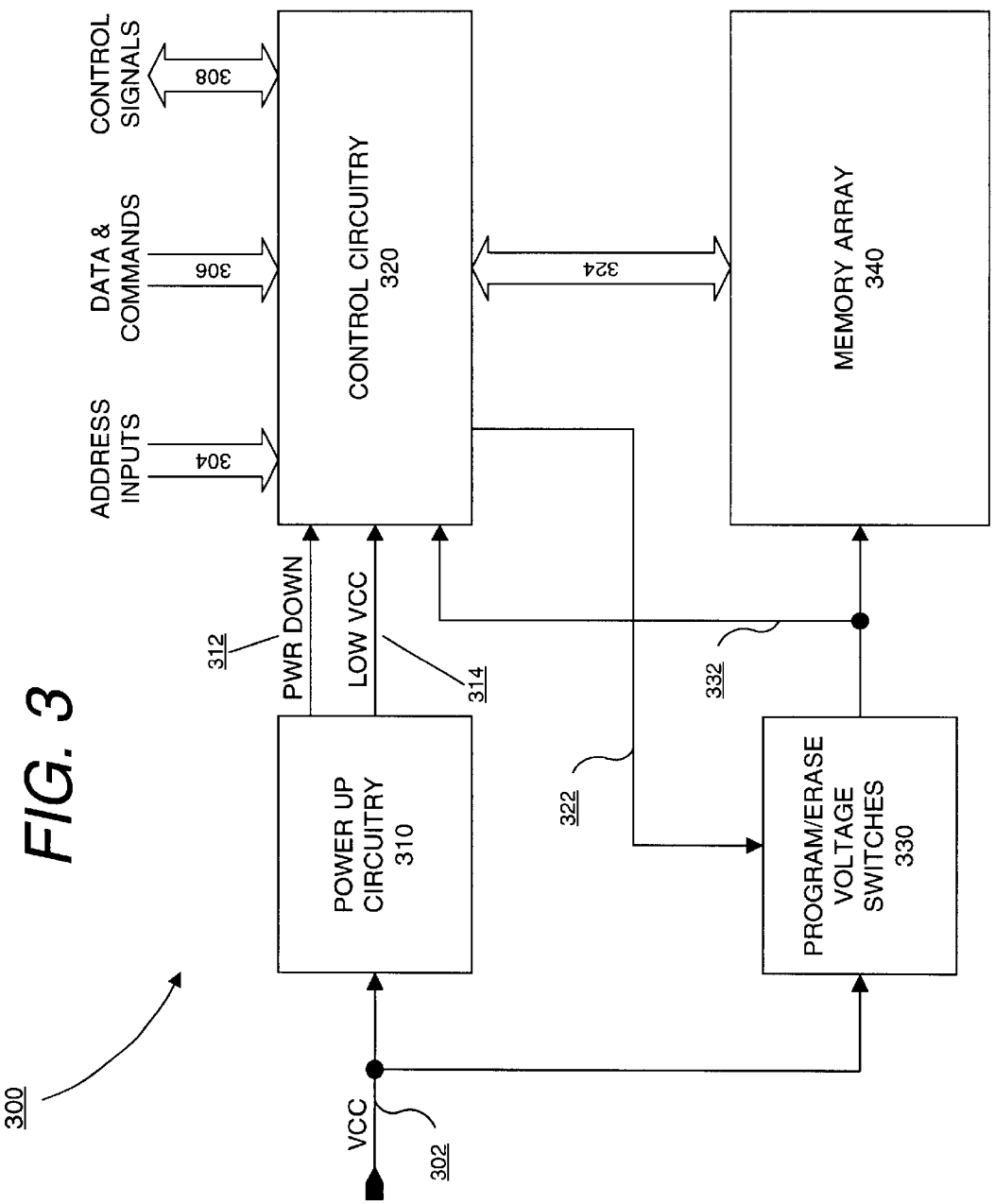
FIG. 3 illustrates an architectural block diagram of a flash memory device for one embodiment.

FIG. 3 illustrates an architectural block diagram of a flash memory device 300 for one embodiment. For this example, the memory architecture comprises of four main blocks: power up circuitry 310, control circuitry 320, program/erase voltage switches 330, and memory array 340. Control circuitry 320 is coupled to ADDRESS INPUTS 304, DATA & COMMAND signals 306, and CONTROL SIGNALS 308.

Control circuitry 320 controls the device operations with respect to memory array 340 via bus 324. The device operations typically include read, programming, and erasure operations. Device operations are selected by writing specific commands into control circuitry 320 via data bus 306. Control circuitry 320 includes address decoding circuitry, write state circuitry, and command state circuitry. Control circuitry 320 controls program/erase voltage switches 330 via line 322 to apply high voltages to the array 340.

VCC 302 provides the program/erase power supply voltage for the flash device 300. For one embodiment, VCC 302 should be approximately 1.8 volts or at least above the minimum operation voltage, as described in more detail below. For another embodiment, VCC 302 can be approximately 3 volts or 5 volts. VCC 302 is coupled to the power up circuitry 310 and program/erase voltage switches 330. As described in more detail below, power up circuitry 310 comprises a mechanism for power supply voltage detection and system lockout to detect the level of VCC 302 that is applied to the flash EEPROM 300. During programming and erasing of the flash array 340, program/erase voltage switches 330 pass a high voltage potential 332 to the memory array 340 and the control circuitry 320.

This flash device 300 has a minimum operating voltage. When the actual VCC voltage 302 supplied to the flash EEPROM 300 is below the minimum operating voltage, all input signals 302, 304, 306, 308 are considered invalid and most of the circuitry 310, 320, 330, 340 in the device 300 cannot function properly. Flash device includes power up circuitry 310 for power supply voltage detection and system lockout. A voltage detection and lockout mechanism detects the voltage level of the actual VCC voltage 302 applied to the flash device 300 and locks out the part when VCC 302 is below the minimum operating voltage.

Power up circuitry 310 receives power supply voltage VCC 302 and provides a reset output signal PWR DOWN 312 to control circuitry 320. PWR DOWN 312 resets control circuitry 320, which in turn locks out the entire flash device 300. Power up circuitry also generates an array protection signal LOW VCC 314 that is sent to control circuitry 320. LOW VCC 314, when active, prevents control circuitry 320 from programming or erasing memory array 340. PWR DOWN 312 and LOW VCC 314 are generated in accordance with the voltage level of the power supply voltage VCC 302 that is applied to the flash device 300. Power up circuitry 310 includes a trip point voltage at which the output of the circuitry 310 flips. The trip point voltage corresponds to the minimum operation voltage specified for the flash device 300. When the voltage level of the VCC supply 302 is below the trip point, the power up circuitry 310 generates PWR DOWN 312 to reset control circuitry 320. In addition, array protection signal LOW VCC 314 is also generated to prevent memory array 340 from being programmed or erased. When the voltage level of VCC 302 has risen above the trip point voltage, power up circuitry 310 deactivates PWR DOWN 312 and causes control circuitry 320 to leave the reset state. The array protection LOW VCC signal 314 is also deasserted.

As described above, the trip point voltage is a voltage level at which power up circuitry 310 switches its output from one state to the other. For one embodiment, power up circuitry 310 allows the trip point voltage to be approximately 1.2 volts. For alternative embodiments, the trip point is approximately 2 volts or somewhere in the range of 2.0 volts to 2.5 volts. For other alternative embodiments, the trip point voltage is adjustable by changing the sizes of the transistors employed in the power up circuitry 310.

Figure 4A:
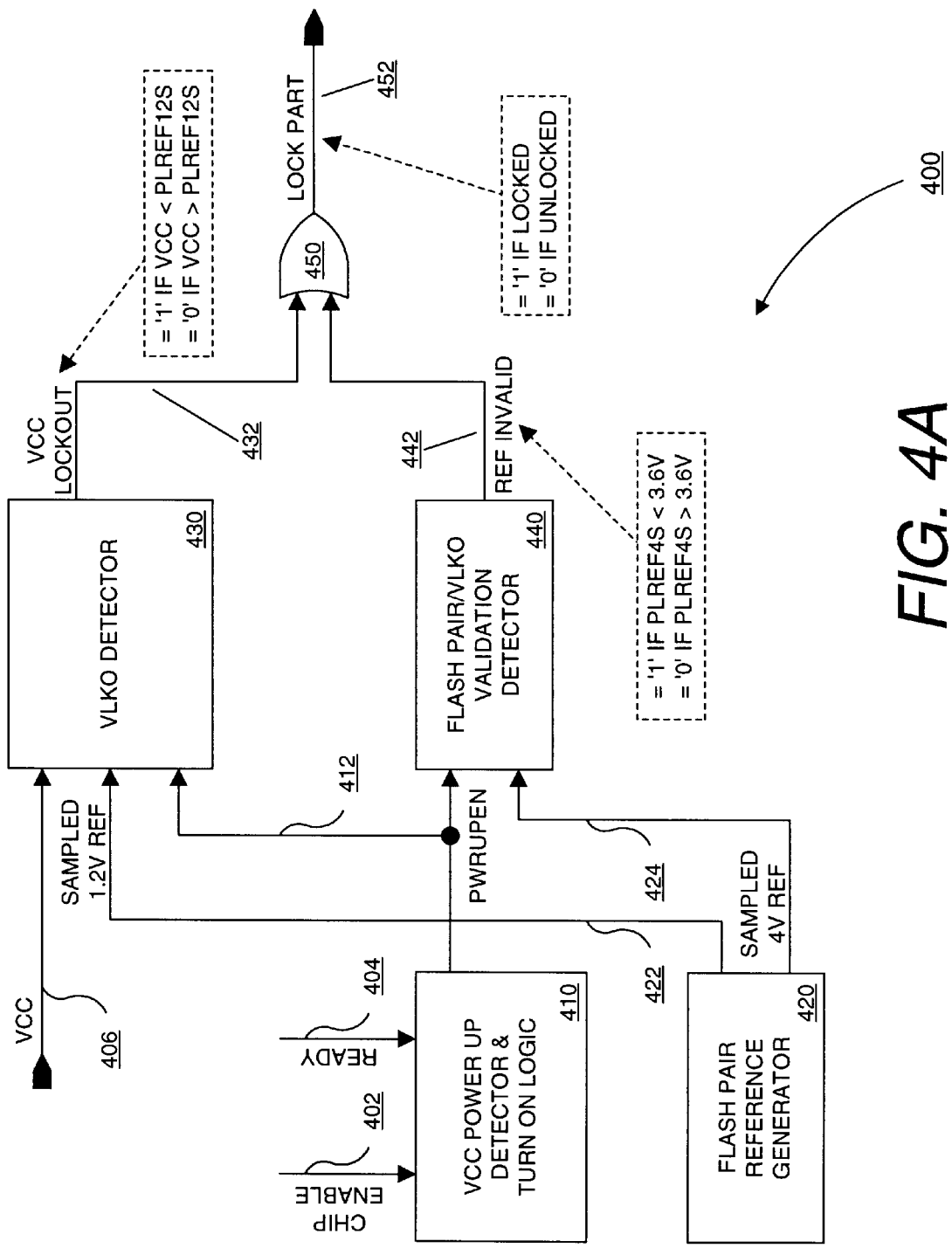
FIG. 4A illustrates a block diagram of a voltage detection and lockout mechanism of one embodiment.

FIG. 4A illustrates a block diagram of a voltage detection and lockout mechanism 400 of one embodiment. This mechanism 400 can reside in the power up circuitry 310 of FIG. 3. Even though VCC 406 is shown as being coupled to only VLKO detector 430 in this example, it should be understood that the VCC supply voltage 406 is actually coupled to a plurality of other circuits. For instance, VCC 406 is also coupled to the VCC power up detector and turn on logic 410, flash pair reference generator, and flash pair/VLKO validation detector 440.

VCC power up detector and turn on logic 410 receives a CHIP ENABLE signal 402 and a READY signal 404. CHIP ENABLE 402 is an external signal that enables the flash device. READY 404 is an internal flash memory signal that indicates whether the flash device is currently performing an algorithm. VCC power up detector and turn on logic 410 provides a PWRUPEN signal 412 to VLKO detector 430 and the flash pair/VLKO validation detector 440. PWRUPEN 412 indicates that a power up sequence or a read or algorithm is currently occurring and enables the VLKO detector 430 and flash pair/VLKO validation detector 440.

When CHIP ENABLE 402 indicates that the part is in standby mode, the VLKO detector 430 and the validation detector 440 are off. When CHIP ENABLE 402 indicates that the part is in read more, the VLKO detector 430 and the validation detector 440 are on. When READY 404 indicates that a program or erase algorithm is in progress, the VLKO detector 430 and the validation detector 440 are turned on. Hence the VLKO detector 430 and flash pair/VLKO validation detector 440 can be turned off when not needed. Turning off these detector circuits 430, 440 can provide additional power savings.

The flash pair reference generator 420 of this embodiment provides two reference voltages: a 1.2 volt reference 422 and a 4 volt reference 424. These reference voltages are generated from a flash pair scheme. A pumped voltage supply is supplied to a flash pair, which in turn provides a first reference potential, the 4 volt reference 424. The 4 volt reference is then divided down to provide a 1.2 volt reference 422. Both references 422, 424 are sampled and held in the reference generator 420. For alternative embodiments, the references can be sampled directly from the reference generator 420 and are not held.

Embodiments of the present invention use an internally generated voltage reference 422 to compare the voltage level of the VCC supply 406. The VLKO detector 430 compares the internally generated 1.2 volt sampled and held reference from the flash pair reference generator 420 with VCC 406 using a differential amplifier. The output 432 of the detector 430 indicates a lockout condition until VCC 406 is greater than 1.2 volts. When the VCC supply 406 is greater than 1.2 volts, the part can be unlocked. Conversely, if VCC 406 is less than 1.2 volts, then the part is locked. This embodiment uses 1.2 volt as the lockout voltage instead of a lower 1 volt lockout voltage to give margin for flash pair trimming variations.

VLKO detector 430 is enabled by PWRUPEN 412. When the VLKO detector 430 is active, the detector 430 takes the VCC supply 406 and the sampled 1.2 volt reference 422, and performs an analog comparison. VLKO detector 430 determines whether the voltage potential of VCC 406 is greater than the lockout voltage, 1.2 volts in this example. Other embodiments may have a lockout voltage other than 1.2 volts. If the VCC voltage 402 is greater than the reference voltage 422, the output signal VCC LOCKOUT 432 of VLKO detector indicates as such. For this embodiment, VCC LOCKOUT 432 is a logic high or '1' if VCC 406 is less than the 1.2 volt reference 422. If VCC 406 is greater than the 1.2 volt reference 422, then VCC LOCKOUT 432 is a logic low or '0'. A logic high on VCC LOCKOUT 432 indicates that the flash part should be locked out due to a low VCC supply voltage.

However, the differential amplifier in the VLKO detector 430 just compares VCC 406 with the 1.2 volt reference 422. The VLKO detector 430 does not verify that the reference 422 is really at 1.2 volt. This is can be an issue because as VCC 406 is powering up, the flash pair reference generator 420 is also generating its reference outputs 422, 424. This means 1.2 volt reference signal 422 is charging up from a low voltage value to its target value of 1.2 volt. Hence the VLKO detector output 432 should not be valid in a power-up situation unless the flash pair outputs 422, 424 are valid. Therefore, a second type of detector, the flash pair/VLKO output validation detector 440, is also needed in this embodiment of the voltage detection and lockout mechanism 400.

The purpose of the validation detector 440 is to validate the output of the VLKO detector 430 by validating the output of the flash pair reference generator 420. This detector 430 validates the 4 volt reference output of the generator 420. Since the 1.2 volt reference 422 used by the VLKO detector 430 is generated by dividing the 4 volt reference 424, if the condition that the 4 volt reference 424 is greater than 3.6 volts is true, then the condition of that the 1.2 volt reference 422 is also greater than 1 volt is also true. For this embodiment, the lockout voltage is 1 volt. If the 4 volt reference output 424 of the generator 420 has a voltage potential of 3.6 volts, the voltage potential of the corresponding 1.2 volt reference output 422 can be calculated by this equation:

$$1.2 \text{ volt}*(3.6 \text{ volt}/4.0 \text{ volt})=1.08 \text{ volt}$$

Hence, the 1.08 volt potential on the 1.2 volt reference 422 is greater than the 1 volt lockout.

Flash pair/VLKO validation detector 440 is enabled by PWRUPEN 412. When the Flash pair/VLKO validation detector 440 is active, the detector 440 takes the sampled 4 volt reference 424 and determines whether the reference 422 is greater than a minimum level, 3.6 volt in this example. In this implementation of the present invention, the 4 volt reference 424 and the 1.2 volt reference 422 are directly related since the 1.2 volt reference is divided down from the 4 volt reference 424. By verifying that the 4 volt reference 424 is at least 3.6 volt, then the 1.2 volt reference 422 should be at least 1 volt. The references 422, 424 are considered valid when the 4 volt reference 424 is at least 3.6 volt and the 1.2 volt reference 422 is at least 1 volt. Hence this detector validates the VLKO detector 430 and flash pair generator 420. One reason for the references being below the required levels is because the VCC supply 406 is below the minimum operating level.

For this embodiment, the detector 440 has the 4 volt reference 424 coupled to the gate terminal of a flash cell having a trip point trimmed to 3.6 volt. If the reference 424 is at least 3.6 volt, the flash cell is turned on and pulls the potential at its drain terminal to ground. The flash pair/VLKO validation detector 440 provides a REF INVALID output signal 442. If the reference 424 is less than 3.6 volt, REF INVALID 442 is a logic high or '1'. REF INVALID 442 is a logic low or '0' if the reference 424 is greater than 3.6 volt. A logic high on REF INVALID indicates that both the 4 volt reference 424 and the 1.2 volt reference 422 from the flash pair reference generator 420 are invalid. Furthermore, since the VLKO detector 430 depends on the 1.2 volt reference 422, its result of VCC LOCKOUT 432 is also invalid.

The flash pair/VLKO validation detector 440 also serves to protect the part when the internal reference nodes are too low. The detector 440 can help to validate the content addressable memory (CAM) registers, whose wordlines are driven with sampled and held reference voltages.

VCC LOCKOUT 432 and REF INVALID 442 are ored together at or gate 450. For another embodiment, or gate 450 may be substituted with another type summation device or other logic to generate an unlock signal. If either input 432, 442 are a logic high, then the LOCK PART output 452 from the or gate 450 is also a logic high. Hence the part is unlocked only when both REF INVALID 442 and VCC LOCKOUT 432 are logic lows. The part is locked otherwise. The LOCK PART signal 452 is coupled to various control circuitry on the flash part and indicates whether the part should be locked out. If LOCK PART 452 is a logic high or a '1', meaning that VCC 406 is below the minimum operating level, then the part should be locked. If LOCK PART 452 is a logic low or a '0', meaning that VCC 406 is greater than the lockout voltage and the references 422, 424 are valid, then the part is unlocked and can perform normal operation.

Since circuit designers will use the power-up scheme of the present invention in low power/low voltage designs, it is extremely important to make this design consume minimal power. In typical prior art products, the power up circuitry was always on, even during standby mode. But as the industry moves toward lower power designs, the power consumed by the power up circuits during standby becomes a significant factor. For instance, one prior art power up detection block consumes about 10 µA of VCC current. But in newer products, the power specification for the whole part for standby mode only 15 µA. Hence, the VCC power up detection circuits need to be optimized for power.

One way this embodiment of the present invention optimizes power is to turn off the VCC power-up detectors (the VLKO detector 430 and the validation detector 440) during standby mode with the PWRUPEN signal 412. Hence the power up blocks are turned on only during power up and user mode (read and algorithm mode). Since the VLKO detector 430 and the validation detector 440 use the sample and held reference signals 422, 424 out of the flash pair, the detectors 430, 440 are ready to detect the VCC levels 406 as soon as PWRUPEN 412 turns the detectors 430, 440 on. The flash pair signals, 1.2 volt reference 422 and 4 volt reference 424, are kept sampled and held through a refreshing scheme, even during standby. By sampling and holding the reference nodes 422, 424, the flash pair reference generator 420 does not need to be kept on. The generator 420 is turned on periodically to refresh the sampled and held reference nodes. This scheme allows for VCC level detection while also saving standby power.

Embodiments of the present invention can consume lower power and would hence be ideal for saving standby power. Power up circuitry standby current consumption can be reduced dramatically. This voltage detection and lockout mechanism can easily be adjusted to detect different levels of VCC lockout levels. For example, in order to detect a higher VCC lockout voltage than the 1.2 volt reference 422 of FIG. 4, the VCC voltage 406 can be divided to desirable range using a resistor divider and the divided voltage can be compared to the 1.2 volt reference 422. Thus one embodiment can be implemented with a 1 volt lockout for a 1.8 volt part and a 2.2 volt lockout for a 2.6 volt part by simply setting a logic bit that turns on the resistor divider. Hence this circuit can operate in chip designed to function at two different VCC ranges (i.e. a 2 volt and 3 volt range).

Furthermore, as VCC supply levels continue to decrease, the conventional flash cell based scheme becomes extremely difficult to use. Erasing the flash cell UV $V_t$ down to less than 2 volt ranges takes a long time. This time requirement and precise $V_t$ control can create numerous problems in the manufacturing flow. Detectors implemented according to the present invention can be operate independent of a flash cell UV $V_t$ that changes with process technology.

One embodiment does not have the trip point variation with temperature as do prior flash cell based schemes. The trip point is based on an internal reference voltage that is more stable across semiconductor process, VCC, and temperature variations. The present invention can also eliminate the need for two flash cells in the power up circuitry as seen in some prior art schemes. In one old scheme, one flash cell was used to detect VCC lockout and a second was used to detect the pump turn on instant, which is usually a higher voltage than the VCC lockout, during power-up. The pump turn on instant determines the time or VCC level at which the positive and negative pumps could be turned on to achieve the necessary read value potentials at their output.

But in the method discussed here, the VLKO detector 430 does not unlock the part until when the VCC 406 has reached the pump turn on instant during the first VCC power up slew. After the initial power up, the detector trip point of this embodiment is adjusted to detect the lock out range only. This feature is made possible by comparing the divided version of VCC 406 during the first slew up with the 1.2 volt reference 422 to determine the pump turn on instant and then only comparing the VCC 406 afterwards for lockout detection. This scheme eliminates the need for two separate detectors to determine lockout voltage and pump turn on instant.

This power up scheme also eliminates a complex implementation where the outputs of the charge pumps are sensed through a feedback loop in order to determine whether the target read values have been achieved during power up. This present scheme allows the pumps to be turned on for a certain fixed delay once VCC 406 has reached the minimum value at which the pumps can function properly.

Figure 4B:
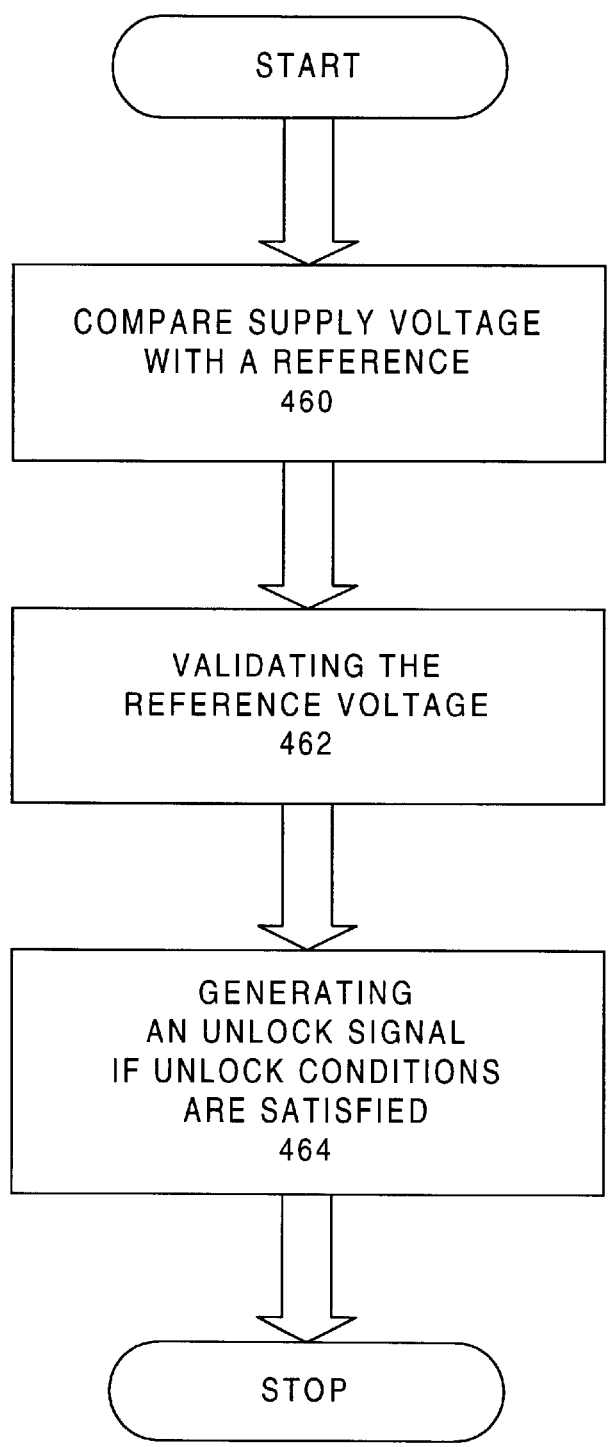
FIG. 4B illustrates a flow chart of a method for voltage detection and lockout for one embodiment.

FIG. 4B illustrates a flow chart of a method for voltage detection and lockout for one embodiment. For this embodiment, the power supply voltage is compared to a reference voltage at step 460. This comparison is to determine whether the supply voltage is greater than the reference voltage. If the reference voltage is greater, then a first lockout signal such as VCC LOCKOUT 432 of FIG. 4A is activated. At step 462, the reference voltage is validated. The reference voltage is checked to determine whether the reference is at least a minimum valid voltage potential. If the reference voltage is not valid, then a signal such as REF INVALID 442 can be activated. The first lockout signal and the reference invalid signal are then checked together. If the two conditions that the power supply voltage is greater than the reference and that the reference voltage is valid are met, then a part unlock signal is generated at step 464. This unlock signal can be used to unlock the rest of the circuitry on the device. For alternative embodiments of the method, the unlock conditions and polarity of the signals may be different.

Figure 5A:
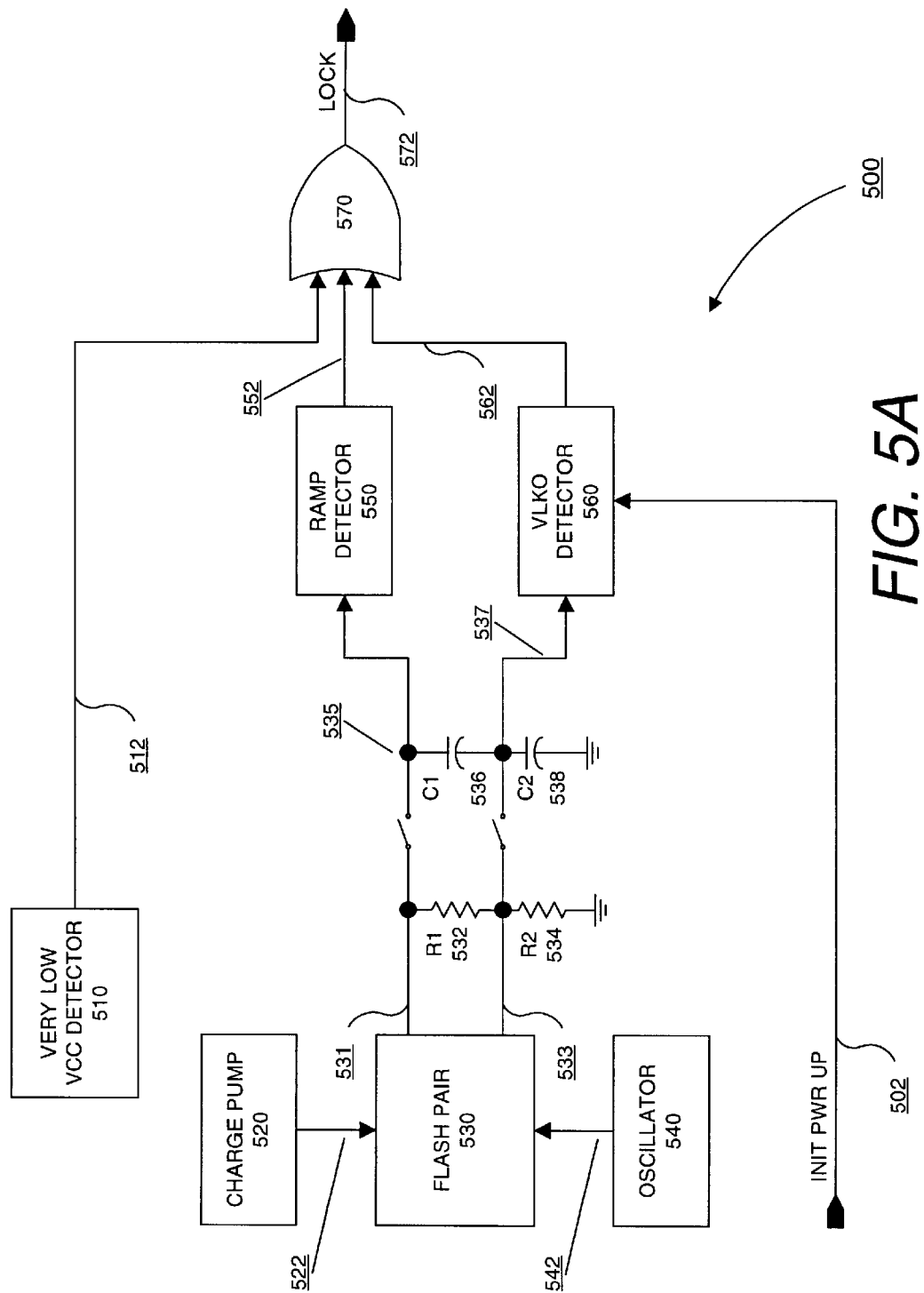
FIG. 5A illustrates a block diagram of a voltage detection and lockout mechanism of another embodiment.

FIG. 5A illustrates a block diagram of a voltage detection and lockout mechanism 500 of another embodiment. The mechanism 500 of this embodiment comprises of a number of circuit blocks: a very low VCC detector 510, a charge pump 520, a flash pair 530, an oscillator 540, a ramp detector 550, and a VLKO detector 560.

Charge pump 520 supplies a pumped supply voltage 522 to flash pair 530. The pumped supply is used to generate voltages references 531, 533. The flash pair of this embodiment is turned on during a power up sequence and during read or user algorithms. During standby, the flash pair 530 is turned on periodically by a refresh signal 542 from oscillator 540 in order to refresh the voltage references 531, 533. In this embodiment, the first voltage reference 531 has a higher voltage potential than the second voltage reference 533.

First reference voltage 531 is coupled to a first terminal of resistor R1 532. Reference 531 is switched/connected to a first terminal of capacitor C1 536 at node 535 periodically to refresh the potential stored on C1 536. Second reference voltage 533 is coupled to a second terminal of R1 532 and a first terminal of resistor R2 534. Second reference 533 is switched/connected to a second terminal of C1 536 and a first terminal of capacitor C2 538 at node 537 periodically to refresh the potential stored on C2 538. Reference voltage 531, 533 are thus sampled and held on C1 536 and C2 538 at nodes 535 and 537 respectively.

Ramp detector 550 takes the first sampled and held reference 535 and determines whether the reference 535 is valid. This detector 550 validates the voltage potential of the reference outputs 531, 533 from the flash pair 530. If the references 531, 533 are invalid, then so will be the result of the VLKO detector 560. The ramp detector 550 couples the reference 535 to the gate of a flash cell. If the reference 535 is approximately equal to or greater than the trimmed Vt of the flash cell, then the detector 550 outputs a logic low. But if the reference 535 is below the acceptable level, detector 550 outputs a logic high and the part should be locked.

VLKO detector 560 takes the second sampled and held reference 537 to perform a comparison with an internal VCC level. If the VCC level is greater than the reference 537, then the VLKO detector 560 outputs a logic low. But if the reference 537 is greater, VLKO detector 560 outputs a logic high, indicating that the part should not be unlocked. The VLKO detector 560 also receives an INITIAL PWR UP signal 502. INITIAL PWR UP 502 indicates whether or not the current power up sequence is the initial one for the part. For this embodiment, INITIAL PWR UP 502 causes the VLKO detector 560 to trip at a higher VCC level.

The output of the ramp detector 550 is coupled to one input terminal of a three input or gate 570. Similarly, the output of the VLKO detector 560 is coupled to a second input terminal of or gate 570. Also coupled to the or gate 570 is a very low VCC detector 510. The output signal LOCK 572 will be a logic high and lock the part if any of the or gate inputs are high. If VCC is above the minimum operating level and the references are valid, then LOCK 572 should be a logic low and the part is unlocked.

Figure 5C:
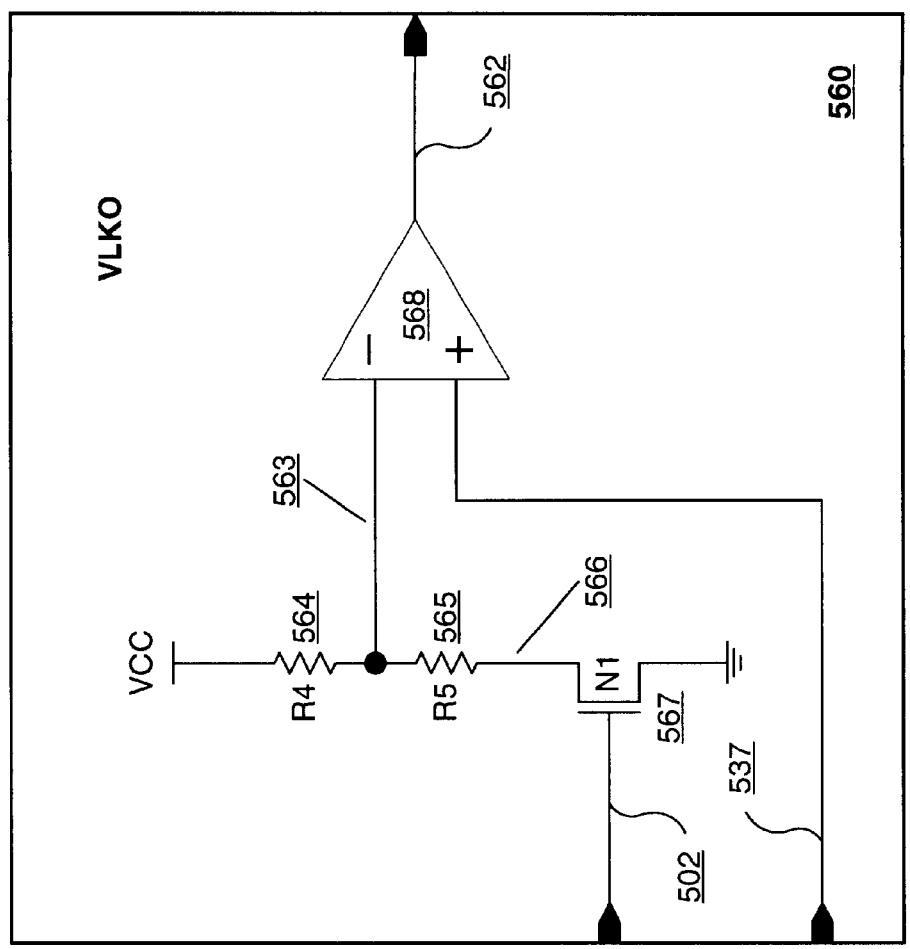
FIG. 5C illustrates one embodiment of a VLKO detector circuit of FIG. 5A.
Figure 5B:
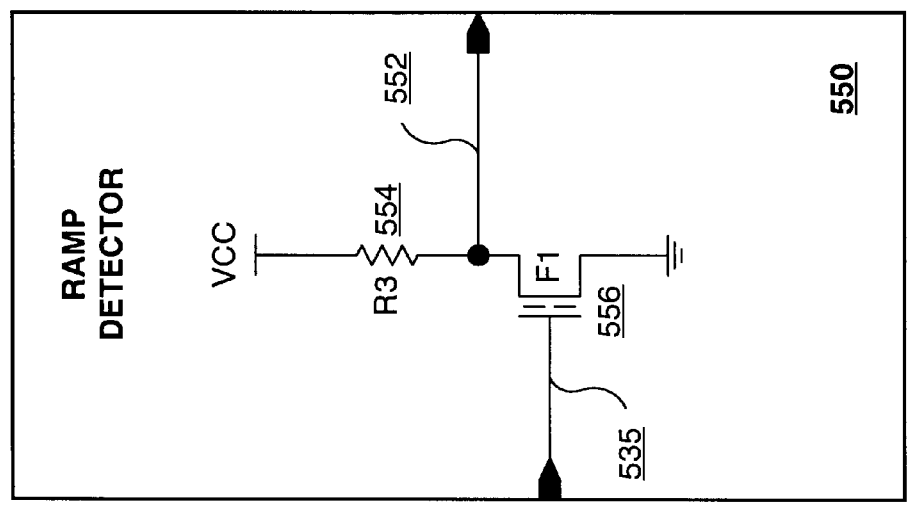
FIG. 5B illustrates one embodiment of a ramp detector of FIG. 5B.

FIG. 5B illustrates one embodiment of a ramp detector 550 of FIG. 5B. VCC supply voltage is connected to a first terminal of resistor device R3 554. The second terminal of R3 554 is connected to a drain terminal of flash transistor F1 556. This node 552 between R3 554 and F1 556 is also the output from the ramp detector 550. Ramp detector 550 receives a sampled 4 volt reference 535. The reference 535 is coupled to the gate terminal of F1 556. The source terminal of F1 556 is connected to a ground potential.

The $V_t$ of F1 556 for this embodiment is trimmed to 3.6 volt. When the reference 535 is less than the $V_t$ of F1 556, F1 556 is off and the detector output 552 is approximately VCC. When the reference input 535 ramps up, F1 556 will gradually turn on as the reference 556 approaches 3.6 volt. F1 556 will pull its drain terminal and the detector output 552 to a ground potential. Hence the detector will indicate that the supplied reference 535 has ramped to equal to or is greater than the $V_t$ of F1 556.

FIG. 5C illustrates one embodiment of a VLKO detector circuit 560 of FIG. 5A. VCC supply voltage is connected to a first terminal of resistor device R4 564. The second terminal of R4 564 is connected to a first terminal of resistor R5 565 at node 563. The voltage potential at node 563, which is directly related to VCC, is to be tested against the minimum operating voltage or the lockout level. The second terminal of R5 565 is connected to the drain terminal of N type transistor device N1 567. The gate terminal of N1 567 is connected to an input signal 502 and the source terminal of N1 567 is connected to a ground potential Input signal 502 here is an indication of whether the current power up cycle is the initial power up of the flash device.

VLKO detector circuit 560 includes a comparator 568 for comparing the voltage levels of two signals 563, 537. Comparator 568 provides a logic output 562 to indicate whether the voltage potential at its positive terminal or at its negative terminal is greater. For this embodiment, if the voltage potential at the positive terminal is greater than that at the negative terminal, comparator output 562 is at a logic high level. Output 562 is a logic low level if the voltage potential at the negative terminal is greater. Node 563 is coupled to the negative terminal of comparator 568. The input signal, a sampled 1.2 volt reference 537, is coupled to the positive terminal of comparator 568. Thus if node 563 is less than the reference voltage 537, the comparator 568, and accordingly the VLKO detector circuit 560, outputs a logic high output on the lock signal 562.

The VLKO detector circuit 560 of this example adjusts the VCC voltage that is tested against the minimum operating voltage as indicated at node 563 depending on whether the part is currently doing an initial power up. When input 502 is a logic high, indicating that this is an initial power up sequence, N type transistor N1 567 is turned on. The voltage potential at node 563 in turn is pulled lower since current is flowing through R5 565 and N1 567. The potential at node 563 during initial power up is approximately VCC*R2/(R1+R2). During a non-initial power up operation, N1 567 is off and node 563 is approximately VCC. Thus the value at node 563 that is compared to the reference voltage 537 during initial power up is less than the approximately VCC value that is compared to the reference voltage.

The lower voltage value at 563 means that the VLKO detector 560 during an initial power up trips later than normally. This additional time allows the VCC to ramp higher before the pumps and the rest of the circuits on the part are turned on. The slew rate of VCC during initial power up can vary widely. The higher VCC allows the charge pumps to function correctly and more efficiently. For this example, the VCC level needed to trip the VLKO detector 560 is when approximately 85% of the VCC supply voltage is equal to 1.2 volt. Hence a VCC level of 1.4 volt is necessary to trip the detector 560 during initial power up. During normal operation, a VCC of 1.2 volt can trip the detector 560.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. An apparatus for voltage detection comprising:

power up detection turn on logic, said turn on logic to enable power up circuitry during a power up sequence;

a lockout voltage detector coupled to said turn on logic, said voltage detector to compare a first reference voltage with a power supply voltage to determine whether said power supply voltage has a greater voltage potential than said first reference voltage;

a validation detector coupled to said turn on logic, said validation detector to determine whether said first reference voltage is valid; and summation logic to generate an unlock signal, said unlock signal active if said power supply voltage is greater than said first reference voltage and if said first reference voltage is valid.

2. The apparatus of claim 1 wherein said power up detection turn on logic is a very low supply voltage detector.

3. The apparatus of claim 1 further comprising a reference generator to generate a first reference voltage.

4. The apparatus of claim 3 wherein said reference generator is a flash pair reference generator.

5. The apparatus of claim 1 wherein said lockout voltage detector generates a supply lockout signal if said first reference voltage is greater than said supply voltage.

6. The apparatus of claim 1 wherein said validation detector determines whether said first reference voltage is at least a predetermined voltage potential.

7. The apparatus of claim 1 wherein said validation detector generates a reference invalid signal if said first reference voltage is less than said valid voltage potential.

8. The apparatus of claim 1 wherein said lockout voltage detector and said validation detector are enabled by said turn on logic.

9. The apparatus of claim 1 further comprising a summation device to generate an unlock signal, said unlock signal active if said supply voltage is greater than said first reference voltage and if said reference voltage is valid.

10. An integrated circuit device comprising:
   power up detection turn on logic, said turn on logic to enable power up circuitry during a power up sequence;
   a reference generator to generate a first reference voltage;
   a lockout voltage detector coupled to said turn on logic, said voltage detector to compare said first reference voltage with a power supply voltage to determine whether said power supply voltage has a greater voltage potential than said first reference voltage;
   a validation detector coupled to said turn on logic, said validation detector to determine whether said first reference voltage is valid; and
   a summation device to generate an unlock signal, said unlock signal active if said supply voltage is greater than said first reference voltage and if said reference voltage is valid.

11. The integrated circuit device of claim 10 wherein said power up detection turn on logic is a very low supply voltage detector.

12. The integrated circuit device of claim 10 wherein said lockout voltage detector and said validation detector are disabled to save power after completion of a power up sequence.

13. The integrated circuit device of claim 10 wherein said lockout voltage detector generates a supply lockout signal if said first reference voltage is greater than said supply voltage.

14. The integrated circuit device of claim 10 wherein said validation detector determines whether said first reference voltage is at least a predetermined voltage potential.

15. The integrated circuit device of claim 10 wherein said validation detector generates a reference invalid signal if said first reference voltage is less than said valid voltage potential.

16. The integrated circuit device of claim 10 wherein said lockout voltage detector and said validation detector are enabled by said turn on logic.

17. The integrated circuit device of claim 10 wherein said integrated circuit device is a flash memory.

18. A system comprising:
   a low voltage power supply to provide a power supply voltage;
   a processor coupled to said power supply;
   a memory coupled to said processor and said power supply, said memory comprising:
      power up detection turn on logic, said turn on logic to enable power up circuitry during a power up sequence;
      a reference generator to generate a first reference voltage;
      a lockout voltage detector coupled to said turn on logic, said voltage detector to compare said first reference voltage with said power supply voltage to determine whether said power supply voltage has a greater voltage potential than said first reference voltage;
      a validation detector coupled to said turn on logic, said validation detector to determine whether said first reference voltage is valid; and
      a summation device to generate an unlock signal, said unlock signal active if said supply voltage is greater than said first reference voltage and if said reference voltage is valid.

19. The system of claim 18 wherein said reference generator is a flash pair reference generator.

20. The system of claim 18 wherein said lockout voltage detector generates a supply lockout signal if said first reference voltage is greater than said supply voltage.

21. The system of claim 18 wherein said validation detector determines whether said first reference voltage is at least a predetermined voltage potential.

22. The system of claim 18 wherein said validation detector generates a reference invalid signal if said first reference voltage is less than said valid voltage potential.

23. The system of claim 18 wherein said lockout voltage detector and said validation detector are enabled by said turn on logic.

* * * * *

UNITED STATES PATENT AND TRADEMARK OFFICE
CERTIFICATE OF CORRECTION

PATENT NO.   : 6,629,047 B1  Page 1 of 1
DATED        : September 30, 2003
INVENTOR(S)  : Guliani et al.

It is certified that error appears in the above-identified patent and that said Letters Patent is hereby corrected as shown below:

Column 9,
Line 65, delete "V,", insert -- $V_t$ --.

Signed and Sealed this

Second Day of March, 2004

JON W. DUDAS
*Acting Director of the United States Patent and Trademark Office*